US012332708B2

(12) United States Patent
Yano

(10) Patent No.: US 12,332,708 B2
(45) Date of Patent: Jun. 17, 2025

(54) PRINTING APPARATUS FOR PRINTING USING POWER SUPPLIED FROM BATTERY OR EXTERNALLY SUPPLIED POWER, CONTROL METHOD THEREFOR, AND STORAGE MEDIUM

(71) Applicant: CANON KABUSHIKI KAISHA, Tokyo (JP)

(72) Inventor: Yukiteru Yano, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 281 days.

(21) Appl. No.: 18/298,475

(22) Filed: Apr. 11, 2023

(65) Prior Publication Data
US 2023/0341913 A1    Oct. 26, 2023

(30) Foreign Application Priority Data

Apr. 21, 2022   (JP) .................................. 2022-070176

(51) Int. Cl.
*B41J 2/32*        (2006.01)
*B41J 29/393*   (2006.01)
(Continued)

(52) U.S. Cl.
CPC ............ *G06F 1/263* (2013.01); *B41J 29/393* (2013.01); *G01R 31/3648* (2013.01); *B41J 2029/3932* (2013.01)

(58) Field of Classification Search
CPC .................................. G06F 1/263; B41J 2/325
See application file for complete search history.

(56) References Cited

U.S. PATENT DOCUMENTS

| | | | |
|---|---|---|---|
| 6,918,645 B2 * | 7/2005 | Takahashi | ................ B41J 29/38 347/19 |
| 2002/0033872 A1 | 3/2002 | Takahashi | |
| 2015/0306868 A1 * | 10/2015 | Ohhashi | ................... B41J 29/38 347/5 |

FOREIGN PATENT DOCUMENTS

| | | |
|---|---|---|
| JP | 10-207585 A | 8/1998 |
| JP | 2000-272210 A | 10/2000 |
| JP | 2002059628 A * | 2/2002 |

OTHER PUBLICATIONS

The above U.S. Patent Application Publication #1 was cited in an Aug. 21, 2023 European Patent Office Search Report, which is enclosed, that issued in European Patent Application No. 23166739.5.

* cited by examiner

*Primary Examiner* — Sharon Polk
(74) *Attorney, Agent, or Firm* — Cowan, Liebowitz & Latman, P.C.

(57) ABSTRACT

A printing apparatus includes an interface that supplies power from the outside, a battery, and a conveyance unit that conveys a printing medium using power from the battery or interface. When the remaining battery level before conveyance of a printing medium starts is determined as being not less than a first threshold, the conveyance unit is caused to convey the printing medium by power from the battery. When the remaining battery level is determined as being less than the first threshold and the printing apparatus is supplied with power from the interface, the battery is charged with power from the interface, the conveyance unit is caused to convey the printing medium, and a second determination is performed for the remaining battery level after the printing medium reaches a predetermined position. When the (Continued)

remaining battery level is determined as being not less than a second threshold, image-printing processing starts.

20 Claims, 8 Drawing Sheets

(51) Int. Cl.
*G01R 31/36* (2020.01)
*G06F 1/26* (2006.01)

PRINTING APPARATUS FOR PRINTING USING POWER SUPPLIED FROM BATTERY OR EXTERNALLY SUPPLIED POWER, CONTROL METHOD THEREFOR, AND STORAGE MEDIUM

BACKGROUND OF THE INVENTION

Field of the Invention

The present invention relates to printing apparatuses, control methods therefor, and storage media, and particularly relates to sublimation thermal transfer type printing apparatuses, control methods therefor, and storage media.

Description of the Related Art

Sublimation thermal transfer type printing apparatuses capable of printing an image shot by a digital still camera, a smartphone, or any other image shooting apparatus are known. Sublimation thermal transfer type printing is a printing method in which a heated thermal head is pressed against an ink ribbon to sublimate ink from solid to gas and apply the ink to a printing sheet. Recently, sublimation thermal transfer type printing apparatuses are demanded to have portability, and highly portable type small printing apparatuses with built-in batteries are popularly used. Many of such small-sized printing apparatuses with built-in batteries are each configured to charge the battery with power received from an external device through a general-purpose external connection interface (hereinafter, simply referred to as an interface or an I/F) such as USB.

Since a thermal head in such a sublimation thermal transfer type printing apparatus includes a large number of heating elements, it is demanded to supply regulated power to the thermal head. Further, a power supply source for such a sublimation thermal transfer type printing apparatus is demanded to have an ability to supply power to all the heating elements substantially simultaneously. However, such power supply increases the load on the power supply source.

Sublimation thermal transfer type printing apparatuses make high electrical loads as described above, and further demand stable power supply without instantaneous interruption. If such a sublimation thermal transfer type printing apparatus is to perform printing with power supplied from an I/F other than the specified power supply adapter, it may cause issues such as adverse effects on printing quality and abnormal heat generation in a terminal portion of the printing apparatus may occur. Therefore, there are few small sublimation thermal transfer type printing apparatuses for printing high-definition photographs, which can perform printing while being directly driven with external power received from an I/F to which various devices such as a USB are connected. Most printing apparatuses supplied with power from USB interfaces are each configured to perform printing while being driven with prescribed power from a built-in battery or a dedicated battery connected to itself.

For example, in response to receiving a print instruction from a user, the printing apparatus described in Japanese Laid-Open Patent Publication (kokai) No. H10-207585 checks the remaining battery level before the start of printing, and stops the printing execution when determining that the battery is in a low battery state such that printing on one sheet is not executable.

For another example, after starting charging, the printing apparatus described in Japanese Laid-Open Patent Publication (kokai) No. 2000-272210 continues the charging until the remaining battery level becomes sufficient for printing on at least one sheet.

However, in response to receiving a print instruction from a user, the printing apparatus described in Japanese Laid-Open Patent Publication (kokai) No. H10-207585 is not allowed to start the printing operation under the condition that the remaining battery level is insufficient for printing on one sheet, even if the printing apparatus is externally supplied with power from the I/F. Such a printing apparatus thus has room for improvement. On the other hand, the printing apparatus described in Japanese Laid-Open Patent Publication (kokai) No. 2000-272210 in the similar situation charges its battery until the remaining battery level becomes sufficient for printing on at least one sheet, which causes a long standby time while the printing apparatus is charging the battery. Such a printing apparatus thus also has room for improvement.

SUMMARY OF THE INVENTION

The present invention provides printing apparatuses, control methods thereof, and storage media, capable of starting reliable printing quickly even if the remaining battery level is insufficient for printing on one sheet when power is supplied from an external connection I/F and of shortening the standby time caused by battery charging.

According to an aspect of the invention, there is provided a printing apparatus that performs image-printing by thermally transferring inks of multiple colors applied to an ink ribbon onto a printing medium in a superimposed manner. The printing apparatus includes an image-printing unit that transfers at least one color of the inks of multiple colors applied to the ink ribbon onto a printing medium. The printing apparatus further includes an interface that supplies power from the outside to the printing apparatus, a battery, and a conveyance unit that conveys a printing medium to an image-printing start position, at which the image-printing unit starts transferring at least one color of the inks of multiple colors onto the printing medium, using power from the battery or the interface. The printing apparatus further includes a control unit that performs, before conveyance of a printing medium is started by the conveyance unit, a first determination to determine whether a remaining battery level of the battery is equal to or more than a first threshold. In a case where the remaining battery level is equal to or more than the first threshold as a result of the first determination, the control unit causes the conveyance unit to convey the printing medium by power from the battery. In a case where the remaining battery level is less than the first threshold as a result of the first determination and the printing apparatus is supplied with power from the interface, the control unit charges the battery with power from the interface, causes the conveyance unit to convey the printing medium, and performs, after the printing medium reaches a predetermined position, a second determination to determine whether a remaining battery level of the battery is equal to or more than a second threshold. In a case where the remaining battery level is equal to or more than the second threshold as a result of the second determination, the control unit starts image-printing processing to cause the image-printing unit to transfer the inks of multiple colors onto the printing medium.

According to another aspect of the invention, there is provided a method for controlling the above printing apparatus. The method includes performing, before conveyance of a printing medium is started by the conveyance unit, a first determination to determine whether a remaining battery level of the battery is equal to or more than a first threshold. The method further includes, in a case where the remaining battery level is equal to or more than the first threshold as a result of the first determination, causing the conveyance unit to convey the printing medium by power from the battery. The method further includes, in a case where the remaining battery level is less than the first threshold as a result of the first determination and the printing apparatus is supplied with power from the interface, charging the battery with power from the interface, causing the conveyance unit to convey the printing medium, and performing, after the conveyance unit is caused to convey the printing medium and the printing medium reaches a predetermined position, a second determination to determine whether a remaining battery level of the battery is equal to or more than a second threshold. The method further includes starting image-printing processing to cause the image-printing unit to transfer the inks of multiple colors onto the printing medium, in a case where the remaining battery level is equal to or more than the second threshold as a result of the second determination.

According to the present invention, the printing apparatus is capable of starting reliable printing quickly even if the remaining battery level is insufficient for printing on one sheet when power is supplied from an external connection I/F and of shortening the standby time caused by battery charging.

Further features of the present invention will become apparent from the following description of exemplary embodiments with reference to the attached drawings.

DESCRIPTION OF THE EMBODIMENTS

The present invention will now be described in detail below with reference to the accompanying drawings showing embodiments thereof.

First Embodiment

Hereinafter, a first embodiment will be described in detail with reference to FIGS. 1A to 6.

In the following description, "printing" refers to the entire series of processes or operations of a printing apparatus from when the printing apparatus performs image-printing on a printing medium based on a print instruction from a user to when the printing apparatus ejects the printing medium. Furthermore, "image-printing" refers to a process or operation of a printing apparatus in the printing, which forms an image on a printing medium (also referred to as a printing sheet or simply a "sheet") by thermally transferring a transfer material (ink or overcoat) applied to an ink sheet or in ribbon onto the printing medium.

Figure 1A:
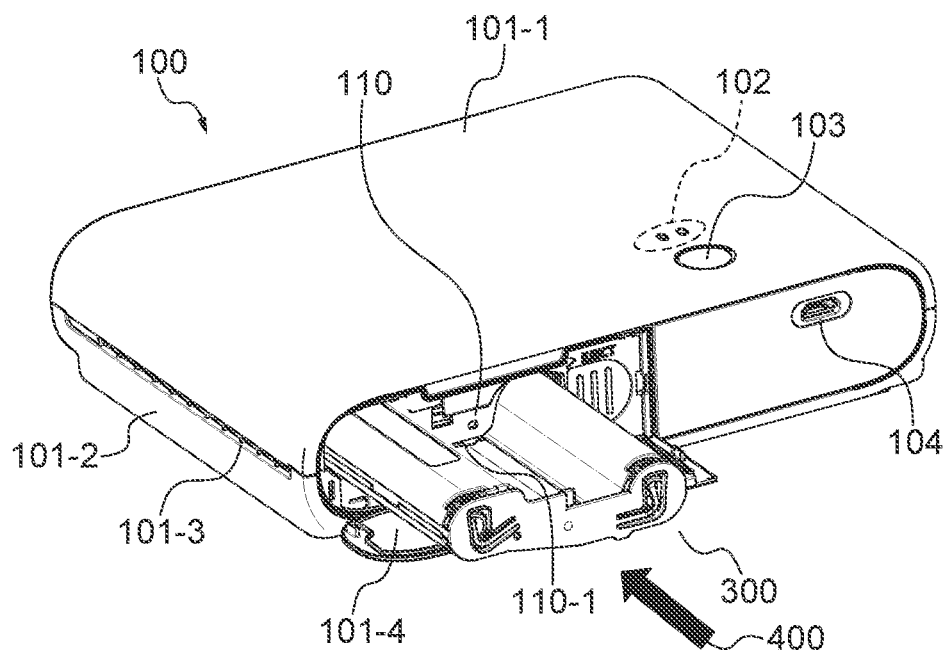
FIGS. 1A, 1B illustrate external perspective views of a printer as a printing apparatus according to the first embodiment and an ink ribbon cassette used in the printer.
Figure 1B:
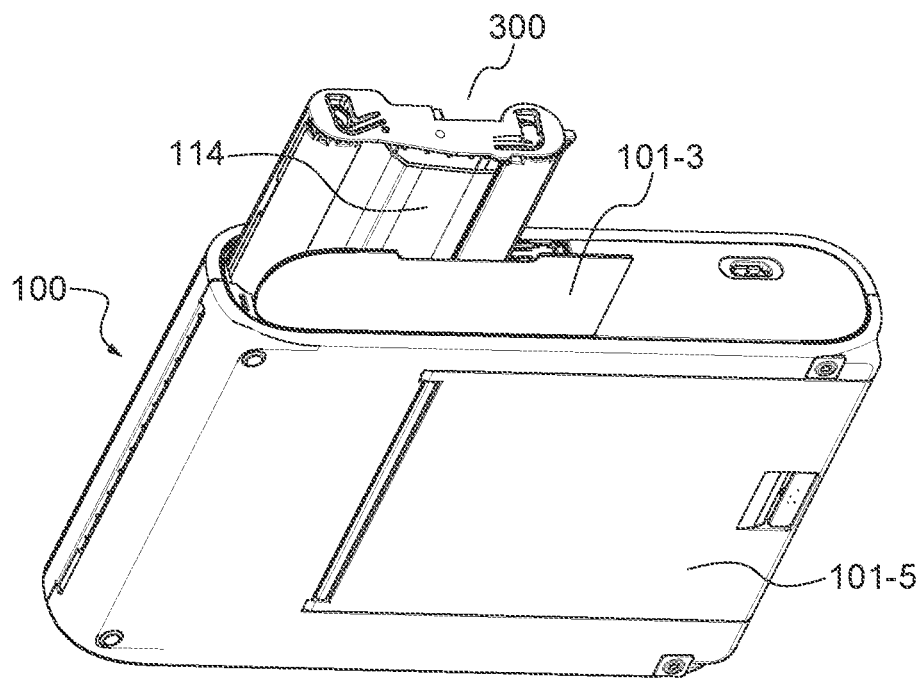

FIGS. 1A and 1B illustrate external perspective views of a printer 100 as a printing apparatus according to the present embodiment and an ink ribbon cassette 300 used in the printer 100. Specifically, FIG. 1A illustrates a perspective view of the printer 100 as viewed from the top side, and FIG. 1B is a perspective view of the printer 100 as viewed from the bottom side.

The printer 100 is a printing apparatus configured to perform image-printing by thermally transferring inks of multiple colors applied to an ink ribbon onto a printing medium in a superimposed manner. As described later, the printer 100 includes a conveyance unit for conveying a printing medium, and an image-printing unit. The conveyance unit is configured to convey a printing medium to an image-printing start position (a position where image-printing is started on the printing medium), and the image-printing unit is configured to transfer at least one color of inks of multiple colors on an ink ribbon onto the printing medium.

The printer 100 includes a hollow housing in which the main body upper case 101-1 and the main body lower case 101-2 are assembled. The printer 100 further includes a sheet-ejection opening 101-3 formed as a gap (opening) between the main body upper case 101-1 and the main body lower case 101-2 on one of side surfaces thereof.

With this configuration, during printing, a sheet 113 as a printing medium (see FIGS. 4A to 4E) is conveyed to transitorily protrude from the sheet-ejection opening 101-3 to the outside of the printer 100, or the sheet 113 on which image-printing has been finished is ejected from the sheet-ejection opening 101-3.

The printer 100 further includes, on its upper surface, an indicator 102 including an LED therein, and a power switch 103 located adjacent to the indicator 102.

In the indicator 102, a plurality of colors of LEDs blinking or lighting up are exposed through windows in an upper portion of the main body upper case 101-1. The lighting up and blinking of the LEDs indicate a power state of the printer 100 and status information about a printing operation, an error, or the likes.

The power switch 103 is an operation button configured to switch on and off the power of the printer 100 by being pressed by a user.

The printer 100 further includes a cassette cover 101-4 supported in an openable and closable manner and a USB connector 104, on another of the side surfaces thereof, which is different from the side surface on which the sheet-ejection opening 101-3 is formed. The printer 100 further includes a chassis 110 having a cassette mounting portion 110-1 inside thereof.

The cassette mounting portion 110-1 is accessible while the cassette cover 101-4 is open. That is, a user is allowed to mount the cassette 300 on the cassette mounting portion 110-1 by opening the cassette cover 101-4 and inserting the ink ribbon cassette 300 (hereinafter, simply referred to as a cassette 300) into cassette mounting portion 110-1 in the direction of the arrow 400.

The cassette 300 contains an ink ribbon 114 coated with sublimation ink and wound into a roll. The ink ribbon 114 is conveyed by a conveyance mechanism (conveyance unit) included in the printer 100.

The USB connector 104 is an I/F (external connection interface), and is configured to electrically connect to an external power adapter or an external device via an USB cable, which is not illustrated, to supply power from the outside to the printer 100 and configured to communicate with an external device.

An openable and closable tray cover 101-5 is provided on the bottom surface of the printer 100.

Figure 4A:
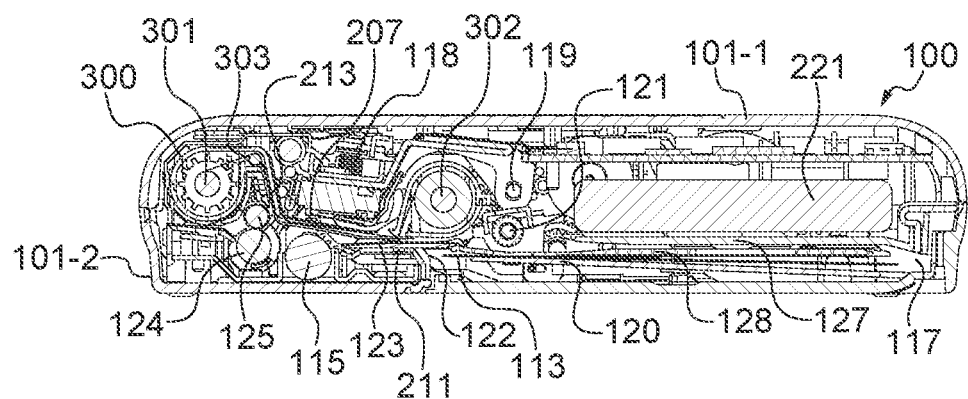
FIGS. 4A to 4E illustrate cross-sectional views depicting the operation of the printer.

While the tray cover 101-5 is open, a user is allowed to load printing sheets 113 (FIG. 4A) into a sheet storage part 117 (FIG. 4A).

Figure 2:
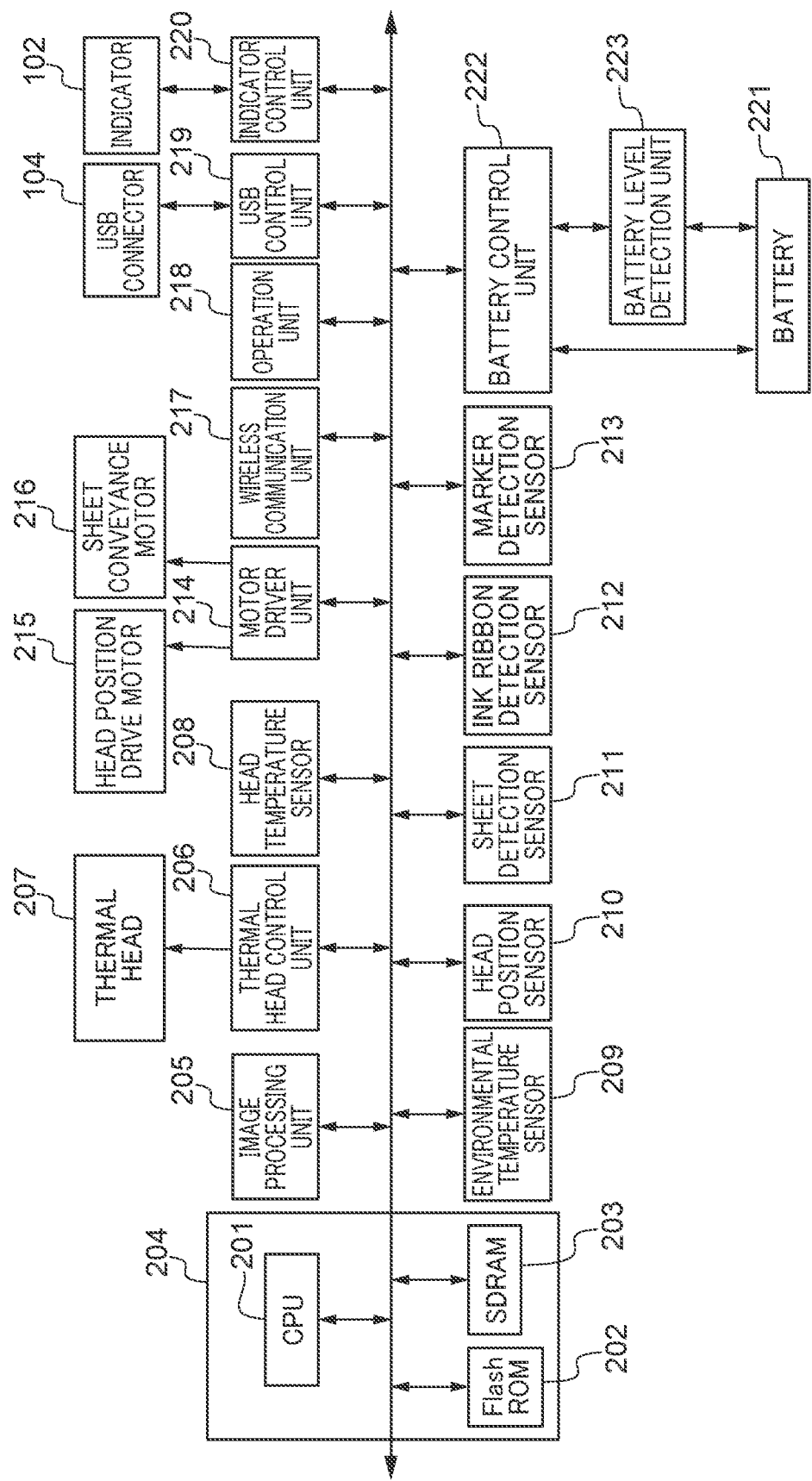
FIG. 2 illustrates a block diagram depicting a hardware configuration example of the printer.

FIG. 2 illustrates a block diagram depicting a hardware configuration example of the printer 100. In FIG. 2, the components illustrated in FIGS. 1A and 1B are denoted by the same reference numerals, and redundant description is omitted.

As illustrated in FIG. 2, the printer 100 includes a main control unit 204, an image processing unit 205, a thermal head control unit 206, a thermal head 207, a head temperature sensor 208, an environmental temperature sensor 209, a head position sensor 210, and a sheet detection sensor 211. The printer 100 further includes an ink ribbon detection sensor 212, a marker detection sensor 213, a motor driver unit 214, a head position drive motor 215, a sheet conveyance motor 216, a wireless communication unit 217, an operation unit 218, and a USB control unit 219. The printer 100 further includes an indicator control unit 220, a battery control unit 222, a battery 221, and a battery level detection unit 223.

The main control unit 204 is configured to control operations of the printer 100, and includes a CPU 201, a flash ROM 202, and an SDRAM 203.

The CPU 201 is configured to perform system control of the printer 100 and computations. The flash ROM 202 stores system control programs for the printer 100. Loading programs from the flash ROM 202, the CPU 201 controls components of the printer 100, based on the loaded programs. The SDRAM 203 transitorily stores image data and uses the image data for data processing work.

Functions and processes of the printer 100 described later are implemented by the CPU 201 loading programs stored in the flash ROM 202 and executing the programs.

The image processing unit 205 is configured to perform image processing on image data transmitted from a digital camera, a mobile terminal, or any other image shooting apparatus. The image processing unit 205 is configured to perform various image processing such as decompression processing on the compressed image data, resizing processing according to sheets 113 to be used, image correction processing, and the like, to generate print data for image-printing on the basis of the image data subjected to the image processing.

As another example, processes executed by the image processing unit 205 may be executed by the main control unit 204 instead of the image processing unit 205, or may be executed by both the image processing unit 205 and the main control unit 204.

The thermal head control unit 206 is configured to convert print data generated by the image processing unit 205 into an electrical signal and output the electrical signal to the thermal head 207. The thermal head 207 is configured to convert the electric signal into thermal energy, and transfers dye (ink) on the ink ribbon 114 (FIG. 1B) onto a sheet 113.

The head temperature sensor 208 is configured to measure the temperature of the thermal head 207 and output the measurement value to the main control unit 204. The environmental temperature sensor 209 is configured to measure the environmental temperature in the printer 100 and output the measurement value to the main control unit 204. The main control unit 204 is configured to correct a drive signal for the thermal head on the basis of outputs of the head temperature sensor 208 and the environmental temperature sensor 209, or causes the thermal head 207 to stand by for driving.

The head position sensor 210 is configured to detect positions such as a pressing position and a retraction position of the thermal head 207, and output a detection result to the main control unit 204. The sheet detection sensor 211 is configured to detect the position of a sheet 113 and output the detection result to the main control unit 204. The ink ribbon detection sensor 212 is configured to detect information about the ink ribbon 114 and output the detected information to the main control unit 204. The marker detection sensor 213 is a reflective optical sensor, and includes a light emitting unit and a light receiving unit so that light emitted from the light emitting unit is reflected bay a reflector on a wall of the ink ribbon cassette 200, and the reflected light is received by the light receiving unit. The marker detection sensor 213 is configured to detect a marker on the ink ribbon 114 when the reflected light is blocked by the marker, and output the detection result to the main control unit 204.

The motor driver unit 214 is configured to control the head position drive motor 215 (second drive unit) and the sheet conveyance motor 216 (first drive unit). The head position drive motor 215 is a motor for driving the thermal head 207 to a pressing position at which image-printing is performed or a retracted position at which the thermal head 207 is retracted so that the cassette 300 can be replaced with another one or a sheet 113 can be conveyed. The sheet conveyance motor 216 is a motor for conveying a sheet 113, and constitutes a conveyance unit of the printer 100.

The main control unit 204 is configured to issue a command to the motor driver unit 214 according to sensor information from the above-described sensors (208 to 213) and information programmed in advance, and control the driving of the head position drive motor 215 and the sheet conveyance motor 216. In the present embodiment, the sheet conveyance motor 216 may be configured to convey the ink ribbon 114. To convey both a sheet 113 and the ink ribbon 114 together, the sheet conveyance motor 216 may rotate a conveyance roller 124 and a sheet feeding roller 121, and further rotate a ribbon winding shaft (which is not illustrated) of the printer 100, coupled to the winding shaft of the ink ribbon 114.

The transmission of the power of the sheet conveyance motor 216 may be switched so that only the conveyance roller 124 and the sheet feeding roller 121 can be rotated to convey a sheet 113, or the ribbon winding shaft of the printer 100 can be driven to convey the ink ribbon without conveying a sheet 113. Instead of conveying a sheet 113 and the ink ribbon 114 by one motor, a drive motor for a sheet 113 and the ink ribbon 114 may be separately provided as a conveyance unit of the printer 100.

The wireless communication unit 217 is configured to control wireless communication with an external device such as a digital camera. The operation unit 218 is configured to receive a user's operation instruction through the power switch 103 or the like provided on the main body upper case 101-1.

The USB control unit 219 is configured to judge information from an external device connected to the USB connector 104, which is an I/F, to perform communication control, configured to control power transfer, and configured to control transmission of various kinds of data such as operation information and image data. The indicator control unit 220 is configured to control output of the indicator 102 such as lighting or blinking of the LEDs of the indicator 102.

The battery control unit 222 is configured to acquire the remaining battery level of the battery 221 detected by the battery level detection unit 223, and perform charge control of the battery 221 and power supply from the battery 221 to the components of the printer 100 on the basis of the acquired remaining battery level.

The battery 221 is built in the printer 100. Note that the battery 221 only needs to be able to supply power to the printer 100 with high reliability, and may be, for example, located outside the printer 100 and connected to the printer 100.

Next, a configuration of the ink ribbon 114 will be described with reference to FIG. 3.

Figure 3:
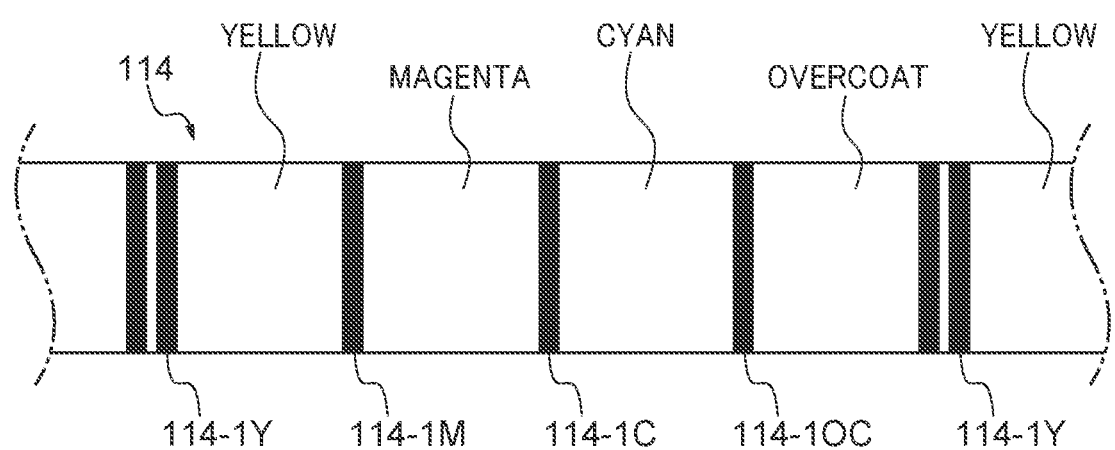
FIG. 3 illustrates a plan view depicting a configuration example of an ink ribbon.

FIG. 3 illustrates a plan view depicting a configuration example of the ink ribbon 114. The ink ribbon 114 has a configuration in which inks (dyes) of multiple colors are regularly arranged one by one in the conveyance direction on a base material thereof. Here, the ink ribbon 114 is for full-color printing, and dye-applied areas of respective colors of yellow (Y), magenta (M), and cyan (C) are arranged on the base material. Image printing is performed by thermally transferring dyes or inks of the respective colors onto a sheet 113 to be superimposed on one another and then a full-color image is formed on the sheet 113. On the base material of the ink ribbon 114, a colorless and transparent overcoat (OC) area for forming a protective layer on the surface of the sheet 113 on which the image has been formed is arranged next to the dye-applied areas.

Markers 114-1Y, 114-1M, 114-1C, and 114-1OC are black belts printed on the base material for detecting the head positions of the dye-applied areas of the respective colors and the OC area, and are provided between these areas. The marker 114-1Y indicating the head of the yellow (Y) dye-applied area is comprised of two printed black belts so as to be distinguished from the other markers 114-1M, 114-1C, and 114-1OC.

The ink ribbon 114 in the present embodiment uses a film having high heat resistance such as a polyethylene terephthalate film having a thickness of about 2 to 10 microns as a base material. In each of the dye-applied areas of colors of yellow (Y), magenta (M), and cyan (C), a sublimation ink prepared by mixing a dye, a binder, a plasticizer, a binder, and the like is applied to a thickness of about 0.2 to 5 μm on the film. In the colorless and transparent overcoat area, a styrene derivative, a styrene resin, a styrene copolymer resin, a binder and the like are applied to a thickness of about 0.5 to 5 μm on the film. In addition, a lubricant for reducing frictional resistance with the sliding portion and stabilizing traveling of the ink ribbon 114, a polishing agent for polishing and cleaning the surface of the thermal head 207, and the like are applied to a surface of the ink ribbon 114 opposite to a surface applied with the sublimation inks.

Next, a printing operation of the printer 100 will be described with reference to FIGS. 4A to 6.

Figure 4B:
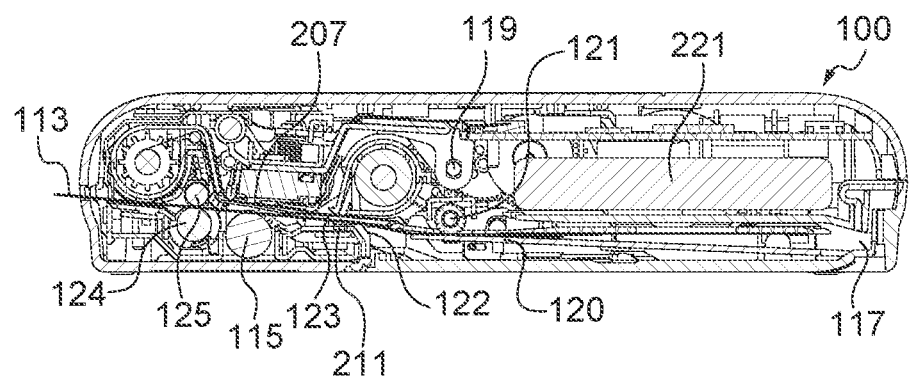
Figure 4C:
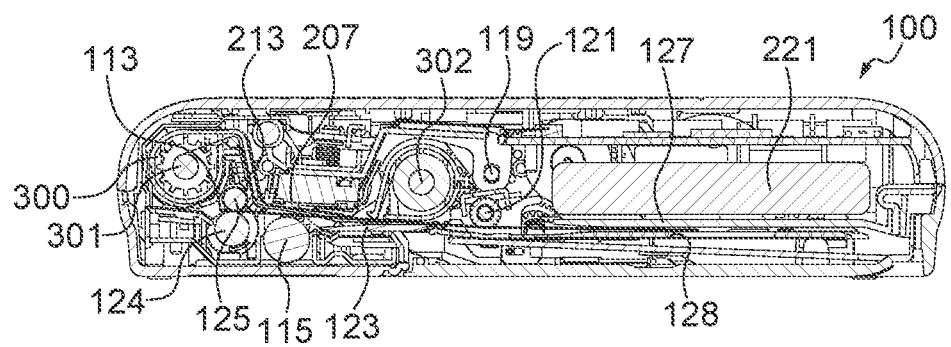
Figure 4D:
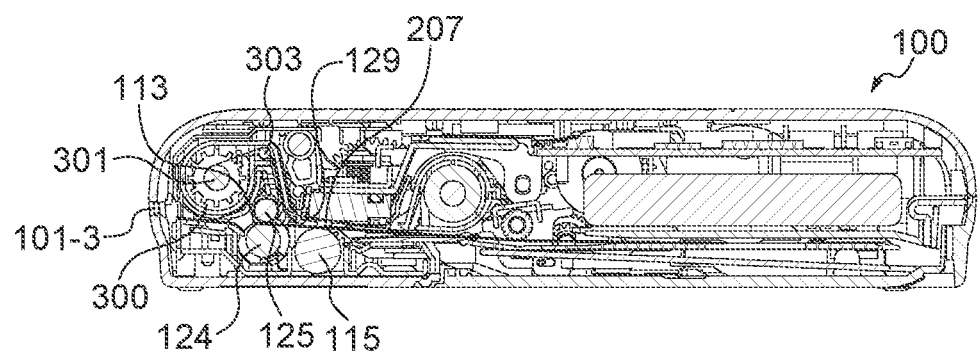
Figure 4E:
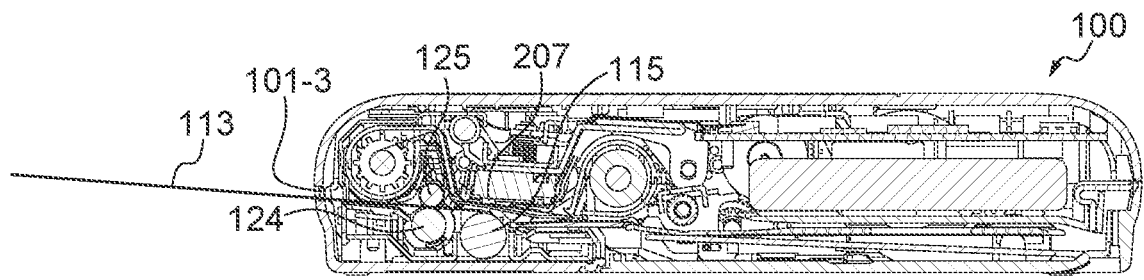
Figure 5:
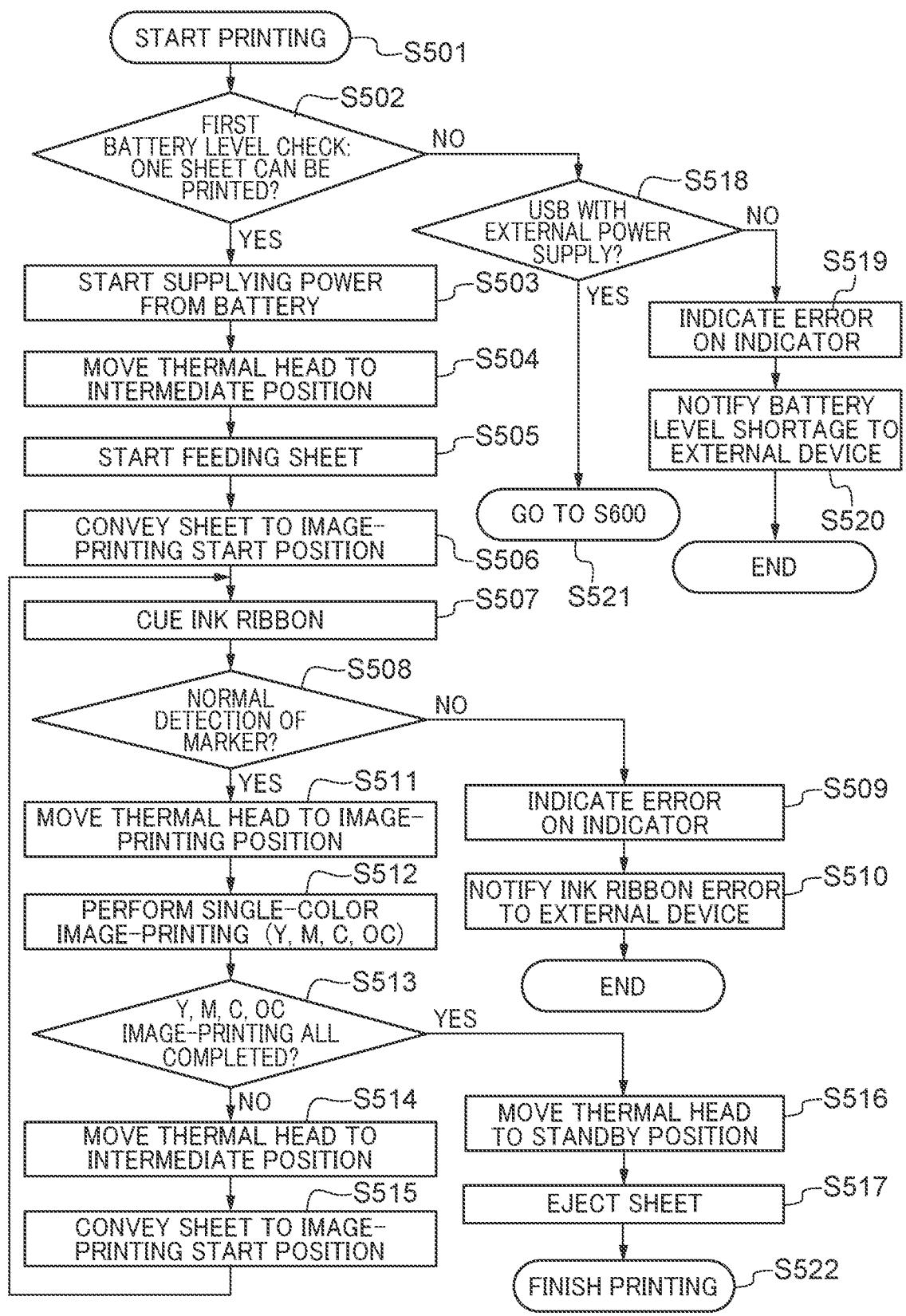
FIG. 5 is a flowchart of printing processing of a printer.

FIGS. 4A to 4E illustrate cross-sectional views depicting the operation of the printer 100, and FIG. 5 is a flowchart of printing processing of the printer 100. FIG. 4A illustrates the printer 100 in an image-printing standby state, FIG. 4B illustrates the printer 100 in a sheet feeding state, FIG. 4C illustrates the printer 100 in a state during image-printing operation, and FIG. 4D illustrates the printer 100 in a state after completion of image-printing and before sheet ejection. FIG. 4E illustrates the printer 100 in a state after the sheet ejection.

As illustrated in FIGS. 1A and 1B, after the cassette 300 is set in the printer 100 by a user, sheets 113 are loaded in the sheet storage part 117, and in response to the power switch 103 being pressed, the printer 100 enters the image-printing standby state as illustrated in FIG. 4A. The printer 100 includes a platen roller 115 and a thermal head 207. The thermal head 207 is rotatably supported by the thermal head rotation shaft 119, and is restricted to a position where a distance from the platen roller 115 is maximized so as not to interfere with the cassette 300 when the cassette 300 is inserted or removed. The platen roller 115 and the thermal head 207 constitute an image-printing unit of the printer 100.

Next, when image data to be printed is specified in an external device like as a digital camera or a smartphone and a print instruction is given, the printer 100 receives information of the print instruction through the wireless communication unit 217. With this reception, the main control unit 204 starts the printing processing illustrated in FIG. 5 (step S501).

When this processing starts, the main control unit 204 performs, before conveyance of a sheet 113 starts, a first determination to determine whether the remaining battery level of the battery 221 is equal to or more than a first threshold. That is, first, the main control unit 204 causes the battery level detection unit 223 to detect the remaining battery level of the battery 221 (hereinafter, referred to as a "first battery level check"). Thereafter, the main control unit 204 determines whether the remaining battery level detected in the first battery level check is equal to or more than a battery level that allows the printer 100 (for example, a conveyance unit and an image-printing unit) to complete image-printing on one sheet using all colors of Y, M, C, and OC (step S502). In other words, the main control unit 204 determines whether the remaining battery level of the battery 221 is equal to or more than the first threshold (first determination).

In consideration of variations in individual capacity and differences in state of the battery 221, it is difficult to accurately detect the remaining battery level in the first battery level check only by measuring the open circuit voltage of the battery 221. Therefore, in the first battery level check of the present embodiment, the battery level detection unit 223 checks how much the voltage drops when a pseudo load under a condition close to the actual load is applied, and detects the remaining battery level with high accuracy. Here, in a case where the remaining battery level sufficient for image-printing on one sheet is detected (YES in step S502), the battery control unit 222 notifies the main control unit 204 of the detection result and starts power supply from the battery 221 to the components of the printer 100 (step S503). At this time, even if the printer 100 is supplied with external power through the USB connector 104, the battery 221 is not charged by the external power supply.

Upon receiving such a notification from the battery control unit 222, the main control unit 204 drives and controls the head position drive motor 215 to rotate the thermal head 207 counterclockwise in FIG. 4A around the thermal head rotation shaft 119. That is, as illustrated in FIG. 4B, the main control unit 204 moves the thermal head 207 to an intermediate position between the standby position in FIG. 4A and the printing position illustrated in FIG. 4C where the thermal head 207 nips with the platen roller 115 (step S504). As a result, position control of the thermal head 207 and the platen roller 115 is performed.

When the movement of the thermal head 207 to the intermediate position is completed, the main control unit 204 starts feeding a sheet 113 from the sheet storage part 117 (step S505). When the sheet feeding starts, the pressure plate 120 is biased toward the sheet feeding roller 121 by a biasing unit (which is not illustrated), and pushes-up sheets 113 stacked in the sheet storage part 117 to press the sheets 113 against the sheet feeding roller 121.

The sheet feeding roller 121 is retracted to a position separated from the sheets 113 at the standby position in FIG. 4A. In the intermediate position illustrated in FIG. 4B, the sheet feeding roller 121 is pushed down to a position in contact with the sheets 113 by a driving force (which is not illustrated). At this time, the driving force of the sheet conveyance motor 216 is transmitted to the sheet feeding roller 121, and the sheet feeding roller 121 rotates in the clockwise direction in FIG. 4B, and conveys a sheet 113 in pressure contact with the sheet feeding roller 121 toward the image-printing unit including the thermal head 207 and the platen roller 115. At this time, sheets 113 abut on the separation bank portion 122 provided in the printer 100. As a result, only one sheet at the top of the sheets 113 in the sheet storage part 117 is conveyed.

Subsequently, when the conveyed sheet 113 is detected by the sheet detection sensor 211 and it is confirmed that there is no sheet feeding failure, the main control unit 204 pushes out the rotatably supported switching plate 123 upward and rotates it in the clockwise direction in FIG. 4B. As a result, the sheet 113 traveling in the left direction in FIG. 4B enters the nip between the conveyance roller 124 and the conveyance driven roller 125. The conveyance roller 124 has a plurality of minute protrusions that pierce the back surface of the sheet 113 so as to accurately convey the sheet 113. The conveyance roller 124 is driven by the sheet conveyance motor 216. The sheet conveyance motor 216 is a stepping motor, and is configured to accurately control the feeding amount of a sheet 113.

After the sheet 113 is conveyed into the nip between the conveyance roller 124 and the conveyance driven roller 125, the main control unit 204 moves the sheet feeding roller 121 to the position of the standby state illustrated in FIG. 4A by power (which is not illustrated). This is to prevent other sheets in the sheet storage part 117 from being erroneously conveyed by the sheet feeding roller 121.

Thereafter, the main control unit 204 continues the conveyance of the sheet 113 by rotating the conveyance roller 124 and the conveyance driven roller 125 by the sheet conveyance motor 216. Thereafter, as a result of the rear end of the sheet 113 passing through the sheet detection sensor 211 and being conveyed by a predetermined amount, the sheet detection sensor 211 detects that the sheet 113 has passed through the front end of the switching plate 123. In response to the detection, the main control unit 204 stops the conveyance of the sheet 113.

Next, the main control unit 204 controls the sheet conveyance motor 216. By this control, the conveyance roller 124 and the conveyance driven roller 125 convey the sheet 113 in the reverse direction, and stop the sheet 113 at the image-printing start position as illustrated in FIG. 4C (step S506). As a result, position control of the sheet 113 and the ink ribbon 114 is performed. At this time, the rear end of the sheet 113 passes through the upper side of the switching plate 123 and the lower side of the sheet feeding roller 121, and is conveyed to a space between the guide wall 127 that partitions and holds the lower portion of the battery 221 and the sheet storage unit wall 128.

When the sheet feeding is completed and the sheet 113 stops at the image-printing start position (when the image-printing preparation operation is completed), the main control unit 204 performs a cueing operation on the ink ribbon 114 (step S507). Here, the cueing is an operation of detecting the head (front) position of an area of the ink ribbon 114 to be used for the next image-printing and adjusting the detected head position to a predetermined position where the image-printing processing is started.

Hereinafter, the cueing of the ink ribbon 114 will be described. When a sheet 113 is conveyed to the position illustrated in FIG. 4C and the conveyance of the sheet 113 to the image-printing start position is completed, the ink ribbon 114 stored in the cassette 300 is rolled up. That is, the tip of the winding shaft 301 arranged in the cassette 300 is engaged with an engaging unit (which is not illustrated) provided in the printer 100, and is rotated counterclockwise in FIG. 4C by power not illustrated, and the ink ribbon 114 wound around the supply shaft 302 is wound around the winding shaft 301.

As illustrated in FIG. 3, markers 114-1Y to 114-1OC are provided at the heads of the areas of the respective colors on the ink ribbon 114, and in particular, the marker 114-1Y at the head of yellow (Y) is comprised of two printed black belts. When the marker detection sensor 213 detects one of the markers on the ink ribbon 114, the main control unit 204 stops the conveyance of the ink ribbon 114 to end the cueing operation.

When the cueing of the ink ribbon 114 is ended, the main control unit 204 determines whether or not the marker 114-1Y comprised of the two printed black belts is normally detected (step S508). In the present embodiment, a case where the marker 114-1Y is not normally detected is a case where the marker detection sensor 213 detects only a marker comprised of one black belt-like print, or a case where the marker detection sensor 213 cannot detect the marker 114-1Y within a specified time. In such a case (NO in step S508), the main control unit 204 controls the indicator 102 to blink to indicate abnormality (error) in the cassette 300 (step S509).

Furthermore, the main control unit 204 notifies, through the wireless communication unit 217, the external device that has transmitted the information of the print instruction to the printer 100 in step S501 that an abnormality has occurred in the ink ribbon 114 (step S510), and finishes the present processing.

On the other hand, in a case where the marker 114-1Y is normally detected (YES in step S508) and the yellow (Y) cueing is completed, the processing proceeds to step S511.

In step S511, the main control unit 204 further rotates a holding unit that holds the thermal head 207 in the counterclockwise direction in FIG. 4B around the thermal head rotation shaft 119. As a result, the thermal head 207 moves to an image-printing position where the ink ribbon 114 and the sheet 113 are sandwiched between the platen roller 115 and the thermal head 207.

Thereafter, in step S512, the main control unit 204 performs image-printing of one single-color image of yellow (Y) on the sheet 113. Specifically, when the movement of the thermal head 207 to the image-printing position is completed, the main control unit 204 conveys the sheet 113 and the ink ribbon 114 toward the sheet-ejection opening 101-3 with the sheet 113 and the ink ribbon 114 being pressed and sandwiched by the thermal head 207 and the platen roller 115 as illustrated in FIG. 4D. During the conveyance, the ink on the ink ribbon 114 is heated by the thermal head 207 and is transferred to the sheet 113.

During the image-printing operation, the ink ribbon 114 and the sheet 113 are conveyed at the same speed. For this purpose, the ink-ribbon conveyance mechanism of the printer 100 includes a torque limiter mechanism (which is not illustrated) configured to slip when a load of a certain torque or more is applied.

When image-printing is performed by the heated thermal head 207, the ink ribbon 114 and the sheet 113 are conveyed while maintaining a close contact state for a certain distance, and then conveyed in respective directions away from each other. That is, the sheet 113 is conveyed leftward in FIG. 4B by the conveyance roller 124, and the ink ribbon 114 is conveyed toward the guide shaft 303 disposed in the cassette 300 while sliding on the peeling plate 129 integrated with in the thermal head 207. The ink ribbon 114, which has been stuck to the sheet 113 due to heat applied by the thermal head 207 for image-printing, is conveyed to the position of the peeling plate 129 and peeled off from the sheet 113.

Thereafter, when the image-printing of a yellow image on the sheet 113 is completed (NO in step S513), the main control unit 204 rotates the holding unit for the thermal head 207 to retract the thermal head 207 to the intermediate position as illustrated in FIG. 4C (step S514). Thereafter, the main control unit 204 controls the sheet conveyance motor 216 to convey the sheet 113 in the direction opposite to the image-printing operation, stops the sheet 113 at the image-printing start position (FIG. 4C) (step S515), and returns to step S507.

Thereafter, similarly to the start of the yellow (Y) image-printing operation, the ink ribbon 114 is wound around the winding shaft 301, and in response to normal detection of the marker 114-1M, the main control unit 204 controls the sheet conveyance motor 216 to convey the sheet 113 to the image-printing start position and then performs image-printing of one single-color image of magenta (M) on the sheet 113. Similarly, cyan (C) image-printing and overcoat (OC) image-printing are performed in the same manner.

When a series of image-printing up to the overcoat image-printing is completed (YES in step S513), as illustrated in FIG. 4E, the main control unit 204 controls the head position drive motor 215 to move the thermal head 207 to the standby position so as to retreat from the sheet 113 (step S516). Next, the main control unit 204 controls the sheet conveyance motor 216 to further convey the sheet 113 in the direction to be ejected from the sheet-ejection opening 101-3, and completes the sheet ejection when the rear end of the sheet 113 passes through the conveyance roller 124 (step S517). When the sheet ejection is completed, the printing is ended, and the present processing is finished (step S522).

Thus, the image-printing operation in which the inks are superimposed and transferred onto the sheet 113 in the order of yellow, magenta, cyan, and overcoat is completed. As described above, in the case where the remaining battery level of the battery 221 detected in the first battery level check in step S502 is more than the battery level that allows the printer 100 to perform image-printing on one sheet using all colors of inks (the remaining battery level is equal to or more than the first threshold), the main control unit 204 carries out the conveyance of the sheet 113 by power from the battery 221 and then performs the image-printing processing without performing the second battery level check. Further, in the case where the remaining battery level of the battery 221 detected in the first battery level check is equal to or more than the first threshold, the main control unit 204 carries out the conveyance of the sheet 113 by power from the battery 221 without charging the battery 221 with power from the USB connector 104 even if the printer 100 is supplied with power from the USB connector 104.

On the other hand, in the case where, at the time of the first battery level check in step S502, the remaining battery level that allows the printer 100 to perform image-printing on one sheet has not been detected (the remaining battery level is less than the first threshold), the USB control unit 219 determines whether the USB connector 104 has external power supply (step S518). When there is no external power supply, that is, no power is supplied from the USB connector 104 to the printer 100 (NO in step S518), the main control unit 204 controls the indicator 102 to blink to indicate an error that printing is impossible (step S519).

Further, the main control unit 204 notifies, through the wireless communication unit 217, the external device that has transmitted the information of the print instruction to the printer 100 in step S501 that printing is disabled due to insufficient battery level (step S520), and finishes the present processing.

Figure 6:
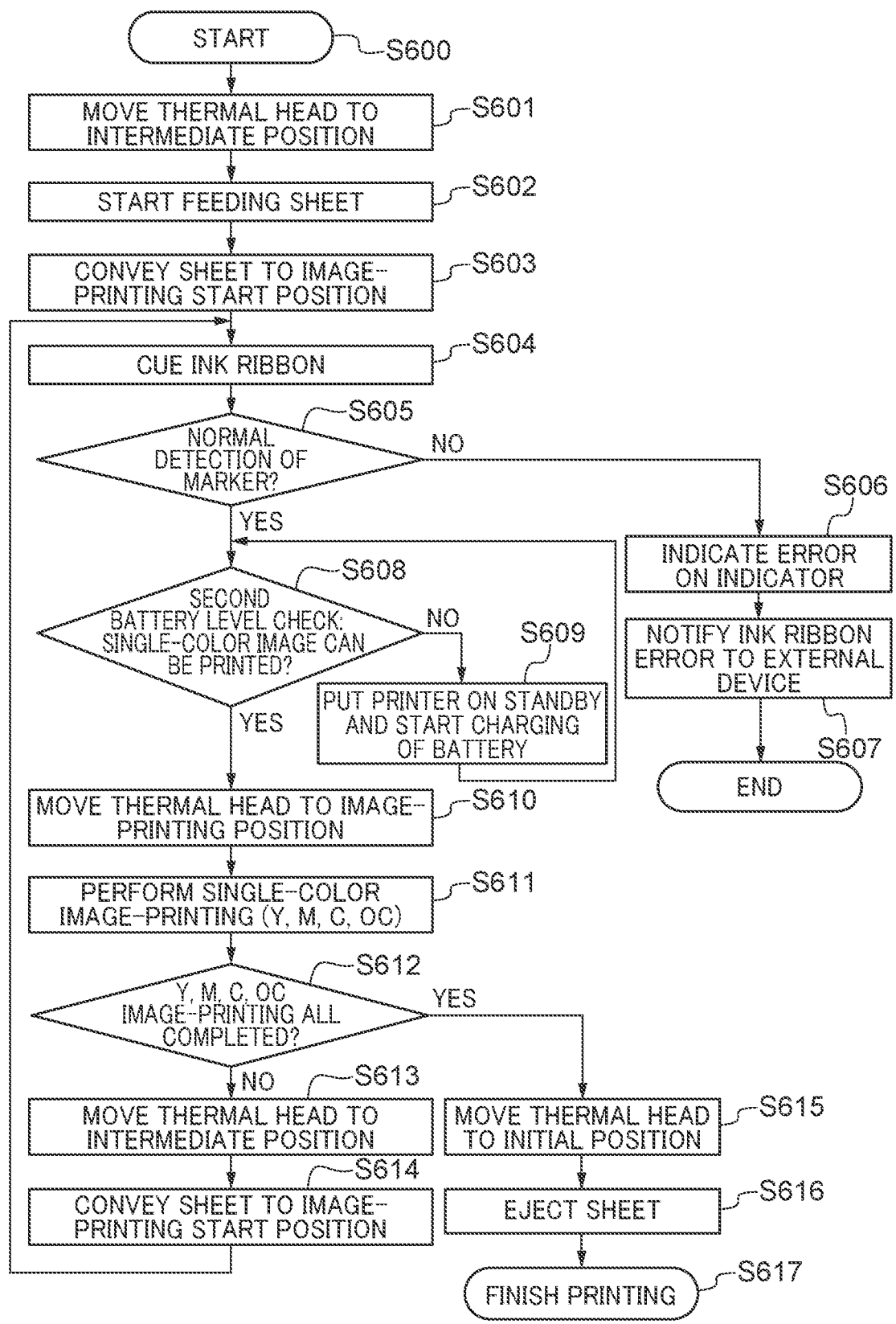
FIG. 6 is a flowchart of printing processing according to the first embodiment, to be executed in step S521 in FIG. 5 in which the remaining battery level is insufficient while power is being supplied externally.

On the other hand, when power is supplied from the outside to the printer 100 via the USB connector 104 (YES in step S518), the processing proceeds to step S600 in FIG. 6 to start the printing processing according to the first embodiment, which is to be executed when the remaining battery level is insufficient power is being supplied externally (step S521).

FIG. 6 is a flowchart of a printing processing according to the first embodiment, to be executed in step S521 of FIG. 5 in which the remaining battery level is insufficient while power is being supplied externally. That is, this processing is printing processing to be executed in a case where the first battery level check fails to detect the remaining battery level that allows the printer 100 to perform image-printing on one sheet (NO in step S502), but the printer 100 is supplied with power the outside (step S518).

First, when the present processing starts in step S600, the main control unit 204 controls the thermal head 207 to move to the intermediate position as illustrated in FIG. 4B (step S601), similarly to step S504 in FIG. 5.

When the movement of the thermal head 207 to the intermediate position is completed, the main control unit 204 starts feeding a sheet 113 from the sheet storage part 117, similarly to step S505 in FIG. 5 (step S602). Similarly to the above-described sheet feeding operation, when it is detected that the sheet 113 has passed through the leading end of the switching plate 123, the main control unit 204 stops the conveyance of the sheet 113.

Next, as in step S506 in FIG. 5, the main control unit 204 carries out conveyance of the sheet 113 in the reverse direction, and stops the sheet 113 at the image-printing start position (predetermined position) as illustrated in FIG. 4C (step S603).

Thereafter, after the sheet feeding operation is completed and the sheet 113 is conveyed to the image-printing start position (when the image-printing preparation operation is completed), the main control unit 204 performs the cueing operation on the ink ribbon 114 as in step S507 in FIG. 5 (step S604). When the cueing operation on the ink ribbon 114 is ended, the main control unit 204 determines whether or not the marker 114-1Y comprised of the two printed black belts is normally detected as in step S508 in FIG. 5 (step S605).

In a case where the marker 114-1Y is not normally detected (NO in step S605), the main control unit 204 controls the indicator 102 to blink to indicate abnormality (error) in the cassette 300 as in step S509 in FIG. 5 (step S606). Further, as in step S510, the main control unit 204 notifies, through the wireless communication unit 217, the external device that has transmitted the information of the print instruction to the printer 100 in step S501 that an abnormality has occurred in the ink ribbon 114 (step S607), and finishes the present processing.

On the other hand, in a case where the marker 114-1Y is normally detected (YES in step S605) and the yellow (Y) cueing is completed, the processing (in FIG. 6) proceeds to step S608.

In step S608, the main control unit 204 causes the battery level detection unit 223 to detect the remaining battery level of the battery 221 (hereinafter referred to as "second battery level check"). Thereafter, the main control unit 204 determines whether the remaining battery level detected in the second battery level check is equal to or more than a battery level that allows the printer 100 to perform image-printing of one single-color image on one sheet for each single color of Y, M, C, and OC (step S608). In other words, the main control unit 204 determines whether the remaining battery level of the battery 221 is equal to or more than the second threshold (second determination).

Also in the second battery level check, the remaining battery level may be checked by the battery level detection unit 223 by a load test using a pseudo load similarly to the first battery level check, but in the load test, there is power consumption due to test execution. Therefore, in the present embodiment, the battery level detection unit 223 stores, as data for use in the second battery level check, the remaining battery level detected in the first battery level check and the power consumption in operation of the printer 100 performed after the first battery level check (or the first determination). That is, in the second battery level check, the battery level detection unit 223 detects the remaining battery level by obtaining a calculation value given by subtracting power consumed by operation of the printer 100 performed after the first battery level check (or the first determination) from the remaining battery level in the first battery check. As described above, in the second battery level check, the remaining battery level is detected using the calculated value, so that the power consumption from the battery 221 can be suppressed.

Here, the second threshold value may be a predetermined value set for each color of Y, M, C, and OC, or may be a predetermined value common to colors of Y, M, C, and OC. For example, the power consumed by the printer 100 to perform image-printing of a black solid image is usually larger than the power consumed by the printer 100 to perform image-printing of one single-color image using each color of Y, M, C, and OC. Therefore, by setting the second threshold to four times the power consumed by the printer 100 to perform image-printing of a black solid image, it is possible to expect a sufficient remaining battery level regardless of an image to be subjected to image-printing. However, when the second threshold value is set with higher accuracy, it shortens the standby time in step S609, which will be described later. For this purpose, the amount of power consumed by the printer 100 to perform image-printing of one single-color image calculated for each color of Y, M, C, and OC of an image subjected to image-printing may be set to the second threshold value.

In a case where the remaining battery level detected in the second battery level check is equal to or more than the second threshold (YES in step S608), the main control unit 204 controls the battery control unit 222 to start the image-printing processing using power from the battery 221, and proceeds to step S610. In the present embodiment, as a result, only the platen roller 115, the thermal head 207, the head position drive motor 215 (second drive unit), and the sheet conveyance motor 216 (first drive unit) are driven by power from the battery 221. In addition, power supplied from the USB connector 104 is used to cover power required by the printer 100 other than the power for the platen roller 115, the thermal head 207, the head position drive motor 215, and the sheet conveyance motor 216.

In step S610, the main control unit 204 controls the thermal head 207 to move to the image-printing position similarly to step S511 in FIG. 5. That is, the second battery level check in step S608 is performed while the platen roller 115 and the thermal head 207 are separated from each other.

Thereafter, in step S611, the main control unit 204 performs image-printing of one single-color image of yellow (Y) on the sheet 113 as in step S512 in FIG. 5. Hereinafter, since steps S612 to S617 are similar to steps S513 to S517 in FIG. 5, the description thereof will be omitted. That is, in FIG. 6, the second battery level check is performed each time when image-printing of one single-color image is performed for one of the colors of Y, M, C, and OC by the processes from steps S604 to S614.

On the other hand, in a case where the remaining battery level detected in the second battery level check is less than the second threshold (NO in step S608), the processing proceeds to step S609.

In step S609, the main control unit 204 causes components of the printer 100 to stand by, causes the battery control unit 222 to start charging the battery 221, and then returns to step S608. Thereafter, when the charging results in that the remaining battery level detected in the second battery level check in step S608 becomes equal to or more than the second threshold (YES in step S608), the processing proceeds to step S610.

According to the present embodiment, the main control unit 204 performs the first battery level check before the conveyance of a sheet 113 is started by the conveyance unit of the printer 100. In the case where the remaining battery level is equal to or more than the first threshold as a result of the first battery level check, and is equal to or more than the battery level that allows the printer 100 to complete image-printing on one sheet using all the colors of Y, M, C, and OC, the main control unit 204 causes the conveyor to convey the sheet 113 by power from the battery 221. At this time, even if power is supplied from the USB connector 104 to the printer 100, it is preferable not to charge the battery 221 with power from the USB connector 104. The main control unit 204 may cause the conveyance unit to convey the ink ribbon 114 using power from the battery 221 to perform cueing of the ink ribbon 114. Thereafter, the main control unit 204 executes the image-printing processing without performing the second battery level check.

In the present embodiment, even in a case where the remaining battery level is less than the first threshold in the first battery level check, and the remaining battery level that allows the printer 100 to perform image-printing on one sheet using all the colors of Y, M, C, and OC is not detected, the main control unit 204 starts a printing operation including sheet feeding while the printer 100 is being supplied with power from the USB connector 104 (when there is external power supply). In addition, the main control unit 204 charges the battery 221 with power from the USB connector 104 at a predetermined timing. In the printing operation, the main control unit 204 may cause the conveyance unit to convey a sheet 113 using power from the battery 221, and cause the conveyance unit to convey the ink ribbon using power from the battery 221 to perform the cueing of the ink ribbon 114. After causing the conveyance unit to convey the sheet 113 to a predetermined position like the image-printing start position and perform the cueing of the ink ribbon 114 to complete the image-printing preparation operation, the main control unit 204 performs a second battery level check. In the case where the remaining battery level is equal to or more than the second threshold as a result of the second battery level check, and the detected remaining battery level is equal to or more than the battery level that allows the printer 100 to perform image-printing of one single-color image for one of the colors of Y, M, C, and OC (YES in step S608), image-printing of one single-color image of at least one color of Y, M, C, and OC is started. On the other hand, in the case where the above remaining battery level is not be detected as a result of the second battery level check, (NO in step S608), the main control unit 204 performs the minimum necessary charging on the battery 221 using power from the USB connector 104. That is, the main control unit 204 performs the charging until the remaining battery level reaches a battery level that allows the printer 100 to perform image-printing of one single-color image each of the colors of Y, M, C, and OC. When the second battery level check is performed each time when image-printing of one single-color image is performed for one of the colors of Y, M, C, and OC, it allows the printer 100 to perform image-printing processing to transferring Y, M, C, and OC inks onto a sheet along while performing the minimum necessary charging of the battery 221.

By controlling the printer 100 as described above, it is possible to shorten a standby time caused by charging of the battery 221 after a print instruction is issued from an external device to the printer 100. That is, in the present embodiment, even when the remaining battery is insufficient to perform image-printing on one sheet by the printer 100 at the time of the first battery level check, the printer 100 starts the printing operation rather than prohibiting the start of printing. It enhances user convenience.

The second threshold value is not limited to the above value. For example, in a case where a use of power from the battery 221 in the image-printing processing has been specified such that the power from the battery 221 is used to cover all the power necessary for the processes of steps S610 to S617 (image-printing of one single-color image of at least one of the multiple colors), the second threshold may be set to a value that enables the specified use of the power from the battery 221.

Second Embodiment

A second embodiment will be described. The present embodiment is different from the first embodiment only in the printing processing when the remaining battery level is insufficient while power is being supplied externally in step S521 in FIG. 5. Therefore, the same configurations and steps as those in the first embodiment are denoted by the same reference numerals, and redundant description will be omitted.

Figure 7:
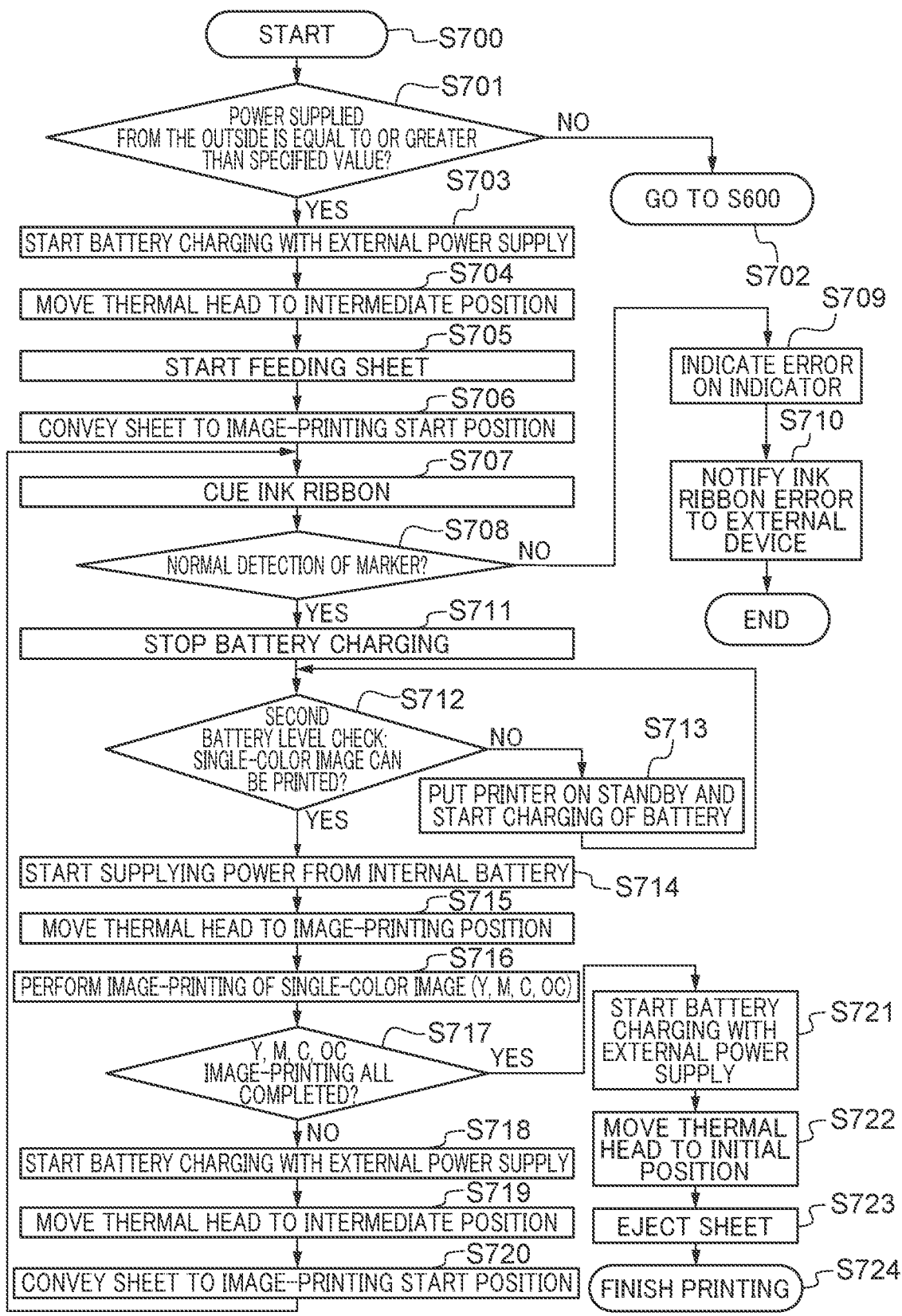
FIG. 7 is a flowchart of a printing processing according to the second embodiment, to be executed in step S521 in FIG. 5 in which the remaining battery level is insufficient while power is being supplied externally.

FIG. 7 is a flowchart of a printing processing according to the second embodiment, to be executed in step S521 in FIG. 5 in which the remaining battery level is insufficient while power is being supplied externally. That is, this processing is a printing processing to be executed when the first battery level check fails to detect the remaining battery level that allows the printer 100 to perform image-printing on one sheet (NO in step S502), but power is externally supplied to the printer 100 via the USB connector 104 (step S518).

When the present processing starts in step S700, the main control unit 204 first uses the USB control unit 219 to determine whether or not the value of power externally supplied via the USB connector 104 is a specified value or more (step S701). The specified value is a power value at which the battery 221 can be charged and the residual power can be used to drive the main control unit 204, motor driver unit 214, and the various sensors to perform the image-printing preparation operation, which is to be carried out before the thermal head 207 is driven for image-printing.

In a case where the value of the power externally supplied is less than the specified value (NO in step S701), the main control unit 204 determines that the power externally supplied is insufficient to perform both the image-printing preparation operation and the charging of the battery 221, and proceeds to step S600 in FIG. 6 (step S702). As a result, the printing processing according to the first embodiment, which is to be executed when the remaining battery level is insufficient while power is being supplied externally, starts.

On the other hand, in a case where the value of the power externally supplied is equal to or more than the specified value (YES in step S701), the processing proceeds to step S703.

In step S703, the main control unit 204 controls the battery control unit 222 to start charging the battery 221 using power externally supplied via the USB connector 104. Next, unlike step S504 in FIG. 5, the battery 221 is being charged, so the main control unit 204 uses the externally supplied power to drive the head position drive motor 215 to move the thermal head 207 to the intermediate position (step S704).

When the movement of the thermal head 207 to the intermediate position is completed, the main control unit 204 starts feeding a sheet 113 from the sheet storage part 117 as in step S505 in FIG. 5 (step S705). Similarly to the above-described sheet feeding operation, when it is detected that the sheet 113 has passed through the leading end of the switching plate 123, the main control unit 204 stops the conveyance of the sheet 113. It should be noted that, unlike step S505, the sheet feeding operation at this time uses not the power supplied from the battery 221 but the power externally supplied.

Next, the main control unit 204 conveys the sheet 113 in the reverse direction, and stops the sheet 113 at the image-printing start position as illustrated in FIG. 4C, similarly to step S506 in FIG. 5 (step S706).

When the sheet feeding operation is completed and the sheet 113 stops at the image-printing start position, the main control unit 204 performs the cueing operation on the ink ribbon 114 as in step S507 in FIG. 5 (step S707). When the cueing operation on the ink ribbon 114 is ended, the main control unit 204 determines whether or not the marker 114-1Y comprised of the two printed black belts is normally detected as in step S508 in FIG. 5 (step S708).

In a case where the marker 114-1Y is not normally detected (NO in step S708), the main control unit 204 controls the indicator 102 to blink to indicate abnormality (error) in the cassette 300 as in step S509 in FIG. 5 (step S709). Further, as in step S510, the main control unit 204 notifies, through the wireless communication unit 217, the external device that has transmitted the information of the print instruction to the printer 100 in step S501 that an abnormality has occurred in the ink ribbon 114 (step S710), and finishes the present processing.

On the other hand, in a case where the marker 114-1Y is normally detected (YES in step S708) and the yellow (Y) cueing is completed, the main control unit 204 stops charging of the battery 221 before performing the second battery level check (step S711), unlike the first embodiment.

Thereafter, similarly to step S608 in FIG. 6 of the first embodiment, the main control unit 204 performs the second battery level check and determines whether the detected remaining battery level is equal to or more than the second threshold (step S712). In the present embodiment, the battery level detection unit 223 stores, as data for use in the second battery level check, not only the remaining battery level detected in the first battery level check and the power consumption in operation of the printer 100 after the first battery level check, but also the time period of the charging performed in steps S703 to S711 as the data. That is, in the second battery level check, the battery level detection unit 223 detects the remaining battery level by obtaining a calculation value given by adding the power charged during the charging time to the remaining battery level detected in the first battery level check, and then subtracting power consumed by operation of the printer 100 performed after the first battery level check (or the first determination) from the added value. As described above, the remaining battery level is detected using the calculated value also in the second battery level check in the present embodiment, so that the power consumption from the battery 221 can be suppressed as much as possible.

In a case where the remaining battery level detected in the second battery level check is equal to or more than the second threshold (YES in step S712), the processing proceeds to step S714.

In step S714, the main control unit 204 controls the battery control unit 222 to start the printing operation with power supplied from the battery 221, and the processing proceeds to step S715.

In step S715, the main control unit 204 controls the thermal head 207 to move to the image-printing position similarly to step S511 in FIG. 5.

As described above, in the present embodiment, after performing the cueing of the ink ribbon 114, the main control unit 204 performs the second battery level check before the thermal head is moved to the print start position, for the following reasons. If the second battery level check is performed after the thermal head 207 is moved to the image-printing position, the ink ribbon 114 and the sheet 113 will maintain pressure contact with each other for a while when battery charging starts due to insufficient remaining battery level. In such a case, if the thermal head 207 has residual heat, it may result in unintended dye transfer on a sheet 113.

Returning to FIG. 7, thereafter, in step S716, the main control unit 204 performs image-printing of one single-color image of yellow (Y) on the sheet 113, similarly to step S512 in FIG. 5. It should be noted that in the image-printing, at least the thermal head 207, which is an image-printing unit, is always driven by power from the battery 221 in order to ensure sufficient image-printing quality. At this time, in order to suppress power consumption as much as possible, externally supplied power may be used as power for various sensors and system control. Further, power supplied externally may be used to drive the sheet conveyance motor 216, the head position drive motor 215, the motor driver unit 214, and the like. Thereafter, when the image-printing of the yellow image on the sheet 113 is completed (NO in step S717), the processing proceeds to step S718.

On the other hand, in a case where the remaining battery level detected in the second battery level check is less than the second threshold (NO in step S712), the main control unit 204 causes components of the printer 100 to stand by, and causes the battery control unit 222 to start charging the battery 221 (step S713).

Thereafter, until the remaining battery level detected in the second battery level check becomes equal to or more than the second threshold (NO in step S712), the processing returns to step S713, and the battery 221 is charged.

In step S718, the main control unit 204 controls the battery control unit 222 to start charging the battery 221 again using power externally supplied via the USB connector 104. Next, unlike step S514 in FIG. 5, while the battery 221 is charged, the main control unit 204 drives the head position drive motor 215 using power externally supplied, to move the thermal head 207 to the intermediate position (step S719).

When the movement of the thermal head 207 is completed, the main control unit 204 controls the sheet conveyance motor 216 to convey the sheet 113 in a direction opposite to the image-printing operation, stops the sheet at the image-printing start position (step S720), and returns to step S707. Also the power required at this time is covered by not the power from the battery 221 but the power received from the outside. Thereafter, similarly to the yellow (Y) image-printing, magenta (M) image-printing, cyan (C) image-printing, and overcoat (OC) image-printing are performed in the same manner.

When a series of image-printing up to the overcoat image-printing is completed (YES in step S717), the main control unit 204 starts charging the battery 221 using power externally supplied, similarly to step S718 (step S721). Next, the head position drive motor 215 is driven with power externally supplied, to move the thermal head 207 to the standby position so as to be retracted from the sheet 113 (step S722).

Next, the main control unit 204 drives the sheet conveyance motor 216 using power externally supplied, to further convey the sheet 113 in the direction to be ejected from the sheet-ejection opening 101-3, and ejects the sheet so that the rear end of the sheet 113 passes through the conveyance roller 124 (step S723). When the sheet ejection is completed, the printing and the charging of the battery 221 using power externally supplied are ended, and the present processing is finished (step S724).

In the present embodiment, as in steps S703, S718, and S721 in the flowchart of FIG. 7, the main control unit 204 starts charging the battery 221 using power (external power) externally supplied from the USB connector 104 while the printer 100 is performing printing and image-printing is not being executed. That is, in a case where the remaining battery level of the battery 221 is less than the first threshold in the first battery level check and the image printing processing is performed while the printer 100 is supplied with power from the USB connector 104, the main control unit 204 charges the battery 221 with the power from the USB connector 104 while the image printing processing is not performed. While such charging is performed on the battery 221, the position movement of the thermal head 207, the conveyance of the sheet 113, and the like are executed using the external power. As a result, the power consumption of the battery 221 during the execution of printing can be suppressed, and the charging increases the remaining battery level. Furthermore, as a result, the remaining battery level detected in the second battery level check in step S712 becomes the sufficient remaining battery level that allows the printer 100 to perform image-printing of one single-color image on one sheet for each single color of Y, M, C, and OC in many cases, and even if the remaining battery level is sufficient, the time required for charging the battery 221 in step S713 can be reduced.

It should be noted that the remaining battery level detected in the second battery level check in step S712 is preferably calculated from the remaining battery level detected in the first battery level check, power consumed by operation of the printer 100 performed after the first battery level check, and time period of battery charging with power from the USB connector 104 while the image-printing processing is not performed.

Furthermore, during the printing illustrated in FIG. 7, the main control unit 204 changes the thermal head 207 and the platen roller 115, which can perform operations that affects the image-printing quality when using the power externally supplied, so as to use power supplied from the battery 221, whose reliability is ensured. On the other hand, power supplied from the outside to the printer 100 via the USB connector 104 is used to cover the power required by the printer to perform the image-printing processing other than the power for the thermal head 207 and the platen roller 115. As a result, it is possible to suppress the power consumption of the battery 221 while ensuring the reliability of the image-printing quality. It should be noted that, during the printing illustrated in FIG. 7, if the power supplied from the battery 221 is also used for the main control unit 204, the reliability of the image quality can be further secured.

Although the preferred embodiments of the present invention have been described above, the present invention is not limited to these embodiments, and various modifications and changes can be made within the scope of the gist of the present invention. For example, the present invention is also applicable to an apparatus incorporating the printer 100.

Other Embodiments

Note that, in the present embodiment, it is also possible to implement processing in which a program for implementing one or more functions is supplied to a computer of a system or an apparatus via a network or a storage medium, and a system control unit of the system or the apparatus reads and executes the program. A system control unit has one or more processors or circuits, and may include a network of multiple isolated system control units or multiple isolated processors or circuits to read out and execute executable instructions.

A processor or circuit may include a central processing unit (CPU), a micro processing unit (MPU), a graphics processing unit (GPU), an application specific integrated circuit (ASIC), and a field programmable gate array (FPGA). The processor or circuit may also include a digital signal processor (DSP), data flow processor (DFP), or neural processing unit (NPU).

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-070176 filed on Apr. 21, 2022 which is hereby incorporated by reference herein in its entirety.

What is claimed is:

1. A printing apparatus that performs image-printing by thermally transferring inks of multiple colors applied to an ink ribbon onto a printing medium in a superimposed manner, the printing apparatus comprising:
    an image-printing unit that transfers at least one color of the inks of multiple colors applied to the ink ribbon onto a printing medium;
    an interface that supplies power from an outside to the printing apparatus;
    a battery;
    a conveyance unit that conveys a printing medium to an image-printing start position, at which the image-printing unit starts transferring at least one color of the inks of multiple colors onto the printing medium, using power from the battery or the interface; and
    a control unit that
        performs, before conveyance of a printing medium is started by the conveyance unit, a first determination to determine whether a remaining battery level of the battery is equal to or more than a first threshold,
        in a case where the remaining battery level is equal to or more than the first threshold as a result of the first determination, causes the conveyance unit to convey the printing medium by power from the battery,
        in a case where the remaining battery level is less than the first threshold as a result of the first determination and the printing apparatus is supplied with power from the interface, charges the battery with power from the interface, causes the conveyance unit to convey the printing medium, and performs, after the printing medium reaches a predetermined position, a second determination to determine whether a remaining battery level of the battery is equal to or more than a second threshold, and
        in a case where the remaining battery level is equal to or more than the second threshold as a result of the second determination, starts image-printing processing to cause the image-printing unit to transfer the inks of multiple colors onto the printing medium.

2. The printing apparatus according to claim 1,
    wherein the first threshold is a remaining battery level of the battery that allows the printing apparatus to complete image-printing on one sheet of the printing medium using all colors of the inks.

3. The printing apparatus according to claim 1, wherein the predetermined position is the image-printing start position.

4. The printing apparatus according to claim 1, wherein in the case where the remaining battery level is equal to or more than the first threshold as a result of the first determination, the control unit performs the image-printing processing without performing the second determination, after causing the conveyance unit to convey the printing medium by power from the battery.

5. The printing apparatus according to claim 1, wherein in the case where the remaining battery level is equal to or more than the first threshold as a result of the first determination, the control unit causes the conveyance unit to convey the printing medium by power from the battery without charging the battery with power from the interface even if the printing apparatus is supplied with power from the interface.

6. The printing apparatus according to claim 1, wherein the conveyance unit is configured to convey the ink ribbon,
in the case where the remaining battery level is equal to or more than the first threshold as a result of the first determination, the control unit causes the conveyance unit to convey the printing medium using power from the battery, and causes the conveyance unit to convey the ink ribbon using power from the battery to perform cueing that adjusts a front position of an area of the ink ribbon to be used for next image-printing, and
in the case where the remaining battery level is less than the first threshold as a result of the first determination and the printing apparatus is supplied with power from the interface, the control unit charges the battery with power from the interface, causes the conveyance unit to convey the printing medium using power from the battery, causes the conveyance unit to convey the ink ribbon using power from the battery to perform the cueing, performs the second determination after the printing medium reaches the predetermined position and the cueing is completed, and starts the image-printing processing in the case where the remaining battery level is equal to or more than the second threshold as a result of the second determination.

7. The image-printing apparatus according to claim 1, wherein the control unit performs the second determination each time when image-printing of one single-color image is performed for one of the multiple colors.

8. The printing apparatus according to claim 1, wherein the second threshold is a threshold set for each of the multiple colors.

9. The printing apparatus according to claim 1, wherein the second threshold is the amount of power required by the printing apparatus to perform image-printing of one single-color image for one of the multiple colors, the amount being calculated for each of the multiple colors.

10. The printing apparatus according to claim 1, wherein the remaining battery level of the battery in the second determination is calculated from the remaining battery level in the first determination and power consumed by operation of the printing apparatus performed after the first determination.

11. The printing apparatus according to claim 1, wherein in a case where the remaining battery level is less than the second threshold as a result of the second determination, the control unit charges the battery with power from the interface until the remaining battery level reaches the second threshold.

12. The image-printing apparatus according to claim 1, wherein the image-printing unit comprises a thermal head and a platen roller, and
the control unit performs the second determination while the thermal head and the platen roller are separated from each other.

13. The printing apparatus according to claim 12, further comprising:
a first drive unit that controls positions of the printing medium and the ink ribbon; and
a second drive unit that controls a position of the image-printing unit,
wherein while image-printing of one single-color image is performed for at least one of the multiple colors in the image-printing processing, the image-printing unit, the first drive unit and the second drive unit are driven with power from the battery, and power from the interface is used to cover power required by the printing apparatus other than the power for the image-printing unit, the first drive unit and the second drive unit.

14. The printing apparatus according to claim 1, wherein while image-printing of one single-color image is performed for at least one of the multiple colors in the image-printing processing, the image-printing unit is driven with power from the battery, and power from the interface is used to cover power required by the printing apparatus other than the power for the image-printing unit.

15. The printing apparatus according to claim 14, wherein while the image-printing of one single-color image is performed for at least one of the multiple colors in the image-printing processing, the control unit is driven with power from the battery.

16. The printing apparatus according to claim 14, wherein in a case where the remaining battery level is less than the first threshold as a result of the first determination, and the image-printing processing is performed while the printing apparatus is supplied with power from the interface, the control unit charges the battery with power from the interface while the image printing processing is not performed.

17. The printing apparatus according to claim 16, wherein the remaining battery level of the battery in the second determination is calculated from the remaining battery level of the battery in the first determination, power consumed by operation of the printing apparatus performed after the first determination, and time period of charging of the battery with power from the interface while the image-printing processing is not performed.

18. The printing apparatus according to claim 1, wherein in a case where a use of power from the battery in the image-printing processing is specified such that the power from the battery is used to cover all power required by the printing apparatus to perform image-printing of one single-color image for at least one of the multiple colors, the second threshold is set to a value that allows the use of the power from the battery.

19. A method for controlling a printing apparatus that performs image-printing by transferring inks of multiple colors applied to an ink ribbon onto a printing medium in a superimposed manner,
the printing apparatus comprising:

an image-printing unit that transfers at least one color of the inks of multiple colors applied to the ink ribbon onto a printing medium;

an interface that supplies power from an outside to the printing apparatus;

a battery; and a conveyance unit that conveys a printing medium to an image-printing start position, at which the image-printing unit starts transferring at least one color of the inks of multiple colors onto the printing medium, using power from the battery or the interface, the method comprising:

performing, before conveyance of a printing medium is started by the conveyance unit, a first determination to determine whether a remaining battery level of the battery is equal to or more than a first threshold;

in a case where the remaining battery level is equal to or more than the first threshold as a result of the first determination, causing the conveyance unit to convey the printing medium by power from the battery;

in a case where the remaining battery level is less than the first threshold as a result of the first determination and the printing apparatus is supplied with power from the interface, charging the battery with power from the interface, causing the conveyance unit to convey the printing medium, and performing, after the printing medium reaches a predetermined position, a second determination to determine whether a remaining battery level of the battery is equal to or more than a second threshold; and in a case where the remaining battery level is equal to or more than the second threshold as a result of the second determination, starting image-printing processing to cause the image-printing unit to transfer the inks of multiple colors onto the printing medium.

20. A non-transitory computer-readable storage medium storing a program for causing a computer to execute a method for controlling a printing apparatus that performs image-printing by transferring inks of multiple colors applied to an ink ribbon onto a printing medium in a superimposed manner, the printing apparatus comprising:

an image-printing unit that transfers at least one color of the inks of multiple colors applied to the ink ribbon onto a printing medium;

an interface that supplies power from an outside to the printing apparatus;

a battery; and a conveyance unit that conveys a printing medium to an image-printing start position, at which the image-printing unit starts transferring at least one color of the inks of multiple colors onto the printing medium, using power from the battery or the interface, the method comprising:

performing, before conveyance of a printing medium is started by the conveyance unit, a first determination to determine whether a remaining battery level of the battery is equal to or more than a first threshold;

in a case where the remaining battery level is equal to or more than the first threshold as a result of the first determination, causing the conveyance unit to convey the printing medium by power from the battery;

in a case where the remaining battery level is less than the first threshold as a result of the first determination and the printing apparatus is supplied with power from the interface, charging the battery with power from the interface, causing the conveyance unit to convey the printing medium, and performing, after the printing medium reaches a predetermined position, a second determination to determine whether a remaining battery level of the battery is equal to or more than a second threshold; and in a case where the remaining battery level is equal to or more than the second threshold as a result of the second determination, starting image-printing processing to cause the image-printing unit to transfer the inks of multiple colors onto the printing medium.

\* \* \* \* \*